(12) United States Patent
Hsiao et al.

(10) Patent No.: US 6,646,310 B2
(45) Date of Patent: Nov. 11, 2003

(54) FOUR TRANSISTOR STATIC-RANDOM-ACCESS-MEMORY CELL

(75) Inventors: Chih-Yuan Hsiao, Feng-Shan (TW); Po-Jau Tsao, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 79 days.

(21) Appl. No.: 09/915,930

(22) Filed: Jul. 26, 2001

(65) Prior Publication Data

US 2002/0047149 A1 Apr. 25, 2002

Related U.S. Application Data

(62) Division of application No. 09/695,161, filed on Oct. 24, 2000, now Pat. No. 6,366,493.

(51) Int. Cl.[7] .............................................. H01L 29/772
(52) U.S. Cl. ....................................... 257/368; 257/288
(58) Field of Search ................................ 257/369, 379, 257/385, 368, 380, 288

(56) References Cited

U.S. PATENT DOCUMENTS 4,780,751 A  * 10/1988  Nishimoto
4,916,668 A  *  4/1990  Matsui
5,373,189 A  * 12/1994  Massit et al.
5,440,513 A  *  8/1995  Smith
5,486,717 A  *  1/1996  Kokubo et al.

* cited by examiner

Primary Examiner—Nathan J. Flynn
Assistant Examiner—Kevin Quinto

(57) ABSTRACT

A four-transistor SRAM cell, which could be viewed as at least including two word line terminals, comprises the following elements: a first word line terminal, a second word line terminal, a first bit line terminal, a second bit line terminal, a first transistor, a second transistor, a third transistor, and a fourth transistor. The gate of the first transistor is coupled to the first word line terminal and the source of the first transistor is coupled to the first bit line terminal, the gate of the second transistor is coupled to the second word line terminal and the source of the second transistor is coupled to the second bit line terminal, the source of the third transistor is coupled to the drain of the first transistor and the gate of the third transistor is coupled to the drain of the second transistor, the source of the fourth transistor is coupled to the drain of the second transistor and the gate of the fourth transistor is coupled to the drain of the first transistor. Significantly, one essential characteristic of the memory cell is that two word line terminals are used to control the state of two independent transistors separately.

3 Claims, 4 Drawing Sheets

FOUR TRANSISTOR STATIC-RANDOM-ACCESS-MEMORY CELL

This is a division of U.S. patent application Ser. No. 09/695,161, filed Oct. 24, 2000 now U.S. Pat. No. 6,366,493.

BACKGROUND OF THE INVENTION

1. Field of the Invention

This invention relates generally to a four-transistor static-random-access-memory (SRAM) memory cell that is suitable for application to the lower power product, that has a reduced size as compared with conventional SRAM cells, or both.

2. Description of the Prior Art

To meet customer demand for small size and low power products, manufacturers are producing newer integrated circuits (ICs) that operate with lower supply voltages and that include smaller internal subcircuits such as memory cells. Many ICs, such as memory circuits or other circuits such as microprocessors that include onboard memory, include one or more SRAM cells for data storage. SRAMs cells are popular because they operate at a higher speed than dynamic random-access-memory (DRAM) cells, and as long as they are powered, they can store data indefinitely, unlike DRAM cells, which must be periodically refreshed.

The conventional structure of the SRAM cell is a six-transistors SRAM cell, which means six transistors are used to form a SRAM cell. In general, advantages of six-transistor SRAM cell at least include high speed and the possibility of low supply voltage. Unfortunately, one unavoidable disadvantage is that the area of the six-transistor SRAM cell is large. Clearly, when the size of the semiconductor device is continually decreased, the disadvantage is more serious and it is desired to overcome the disadvantage by either improving the structure of the six-transistor SRAM cell or providing a new SRAM cell.

One way to reduce the area of the six-transistor SRAM cell is to make the structure three-dimensional. However, the solid structure of the six-transistor SRAM cell also complicates relative fabrication and configuration of the six-transistor SRAM cell. In other words, this way is not an efficient way to overcome the disadvantages of known devices.

Another popular way to reduce the area of six-transistor SRAM cell is the application of a four-transistor SRAM. Although there are numerous varieties of four-transistor SRAM cell, the basic structure of the four-transistor SRAM cell can be divided into two access transistors and two pull-down transistors. Herein, as usual, one access transistor and one pull-down transistor are used to store data, another access transistor and another pull-down transistor are used to control reading/writing processes. Clearly, owing to the number of transistors being used is decreased, the occupied area of four-transistor SRAM cell is less than that of the six-transistor SRAM cell. Thus, the four-transistor SRAM cell is more suitable for ICs whenever sizes of ICs are reduced. Even four-transistors also meet some disadvantages such as higher off-state leakage current of PMOS. More introduction of four-transistor SRAM cell can be provided by referring to U.S. Pat. Nos. 5,943,269, 6,091,628, 6,044,011, 6,011,726, and 5,751,044.

One ordinary circuit diagram of four-transistor SRAM cell is shown in FIG. 1. The four-transistor SRAM cell, which is a loadless four-transistors SRAM cell, comprises first transistor 11, second transistor 12, third transistor 13, fourth transistor 14, first word line terminal 15, second word line terminal 16, first bit line terminal 17 and second bit line terminal 18. In detail, source of first transistor 11 is coupled to first bit line terminal 17, gate of first transistor 11 coupled to first word line terminal 15, drain of first transistor 11 is coupled to gate of fourth terminal 14, source of second transistor 12 is coupled to second bit line terminal 18, gate of second transistor is coupled to second word line terminal 16, drain of second transistor 12 is coupled to gate to third transistor 13. More over, drain of fourth transistor 14 and drain of third transistor 13 are coupled to a common voltage point 19, such as electrical zero point, each of both first bit line terminal 17 and second bit line terminal 18 is coupled to a corresponding bit line, and both first word line terminal 15 and second word line terminal 16 are coupled to the same word line.

Because leakage current of first transistor 11 and leakage current of second transistor 12 are not absolute zero, especially when first transistor 11/second transistor 12 are P-type transistor. An unavoidable shortage is that because first word line terminal 15 and second word line terminal 16 by same word line, third transistor 13 is turn on by leakage current of second transistor 12 whenever both first transistor 11 and second transistor 12 are not totally turn off. Thus, whenever current is sent to first bit line terminal 17 (means data is storaged), owing to both first transistor 11 and third transistor 13 are not totally turn off now, current continually flow through first transistor 11 and third transistor into common voltage point 19. Significantly, continuous flow of current requires continuous supply of current, then stand-by current of the four-transistor SRAM cell is not negligible and the four-transistor SRAM cell is less suitable for low power product.

Therefore, although the four-transistor SRAM is physically smaller and is suitable for some ICs that include smaller internal subcircuits, it still is not suitable for operation at low supply power. Improvement of the four-transistor SRAM is desired to make it suitable for a low power product.

SUMMARY OF THE INVENTION

One main object of the invention is to present a four-transistor SRAM cell which is suitable for a low power product.

Another important object of the invention is to present a four-transistor SRAM cell which is easy to be produce, especially the differences between the present four-transistor SRAM cells and other well-known four-transistor SRAM cells are not too large to let fabrication of the present four-transistor SRAM cell be strongly different from fabrication of the well-known four-transistor SRAM cell.

Still an essential object of the invention is to present a four-transistor SRAM cell by limiting the circuit diagram of the present four-transistor SRAM cell but not limiting the structure of the present four-transistor SRAM cell. In other words, there are various structures of the present four-transistor SRAM cell.

One embodiment of the invention is a memory cell, a four-transistor SRAM cell, which comprises the following elements: a first word line terminal, a second word line terminal, a first bit line terminal, a second bit line terminal, a first transistor, a second transistor, a third transistor, and a fourth transistor. The gate of the first transistor is coupled to the first word line terminal and the source of the first transistor is coupled to the first bit line terminal, the gate of the second transistor is coupled to the second word line terminal and the source of the second transistor is coupled to the second bit line terminal, the source of the third transistor is coupled to the drain of the first transistor and the gate of the third transistor is coupled to the drain of the second transistor, the source of the fourth transistor is coupled to the drain of the second transistor and the gate of the fourth transistor is coupled to the drain of the first transistor.

BRIEF DESCRIPTION OF THE DRAWINGS

A more complete appreciation and many of the attendant advantages thereof will be readily obtained as the same becomes better understood by reference to the following detailed description when considered in connection with the accompanying drawings.

DESCRIPTION OF THE PREFERRED EMBODIMENT

Figure 2:
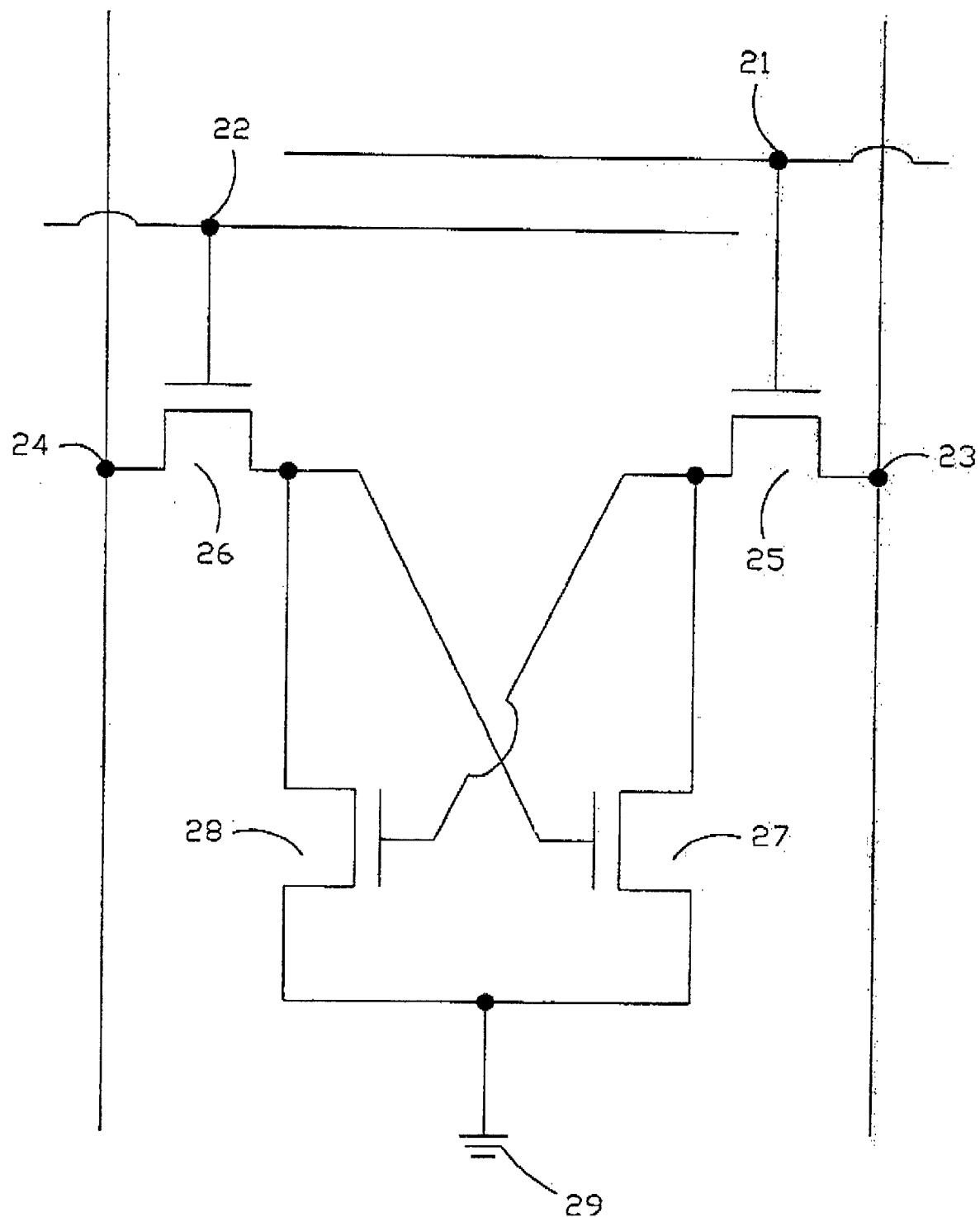
FIG. 2 is a sketch map of a circuit diagram of a four-transistor SRAM cell according to an embodiment of the invention.

One preferred embodiment is a memory cell, a four-transistors SRAM cell. As shown in FIG. 2, circuit diagram of the embodiment comprises: first word line terminal 21, second word line terminal 22, first bit line terminal 23, second bit line terminal 24, first transistor 25, second transistor 26, third transistor 27 and fourth transistor 28. Wherein, each word line terminal (21, 22) is coupled to a word line, and each bit lint terminal (23, 24) is coupled to a bit line. Clearly, basic elements of the present four-transistors SRAM cell is similar to well-known four-transistors SRAM cell. Then, the differences between the present four-transistors SRAM cell and well-known four-transistors SRAM cell are functions and relations of these basic elements.

As shown in FIG. 2, gate of first transistor 25 is coupled to first word line terminal 21 and source of first transistor 25 is coupled to first bit line terminal 23, gate of second transistor 26 is coupled to second word line terminal 22 and source of second transistor 26 is coupled to second bit line terminal 24, source of third transistor 27 is coupled to drain of first transistor 25 and gate of third transistor 27 is coupled to drain of second transistor 26, source of fourth transistor 28 is coupled to drain of second transistor 26 and gate of said fourth 28 transistor is coupled to drain of first transistor 25. Moreover, first word line terminal 21 and second word line terminal 22 are controlled separately, which means voltage of first word line terminal 21 could be different than, and be controlled separately, voltage of second word line terminal 22. Besides, first bit line terminal 23 and second bit line terminal 24 also are coupled to corresponding bit lines.

Figure 1:
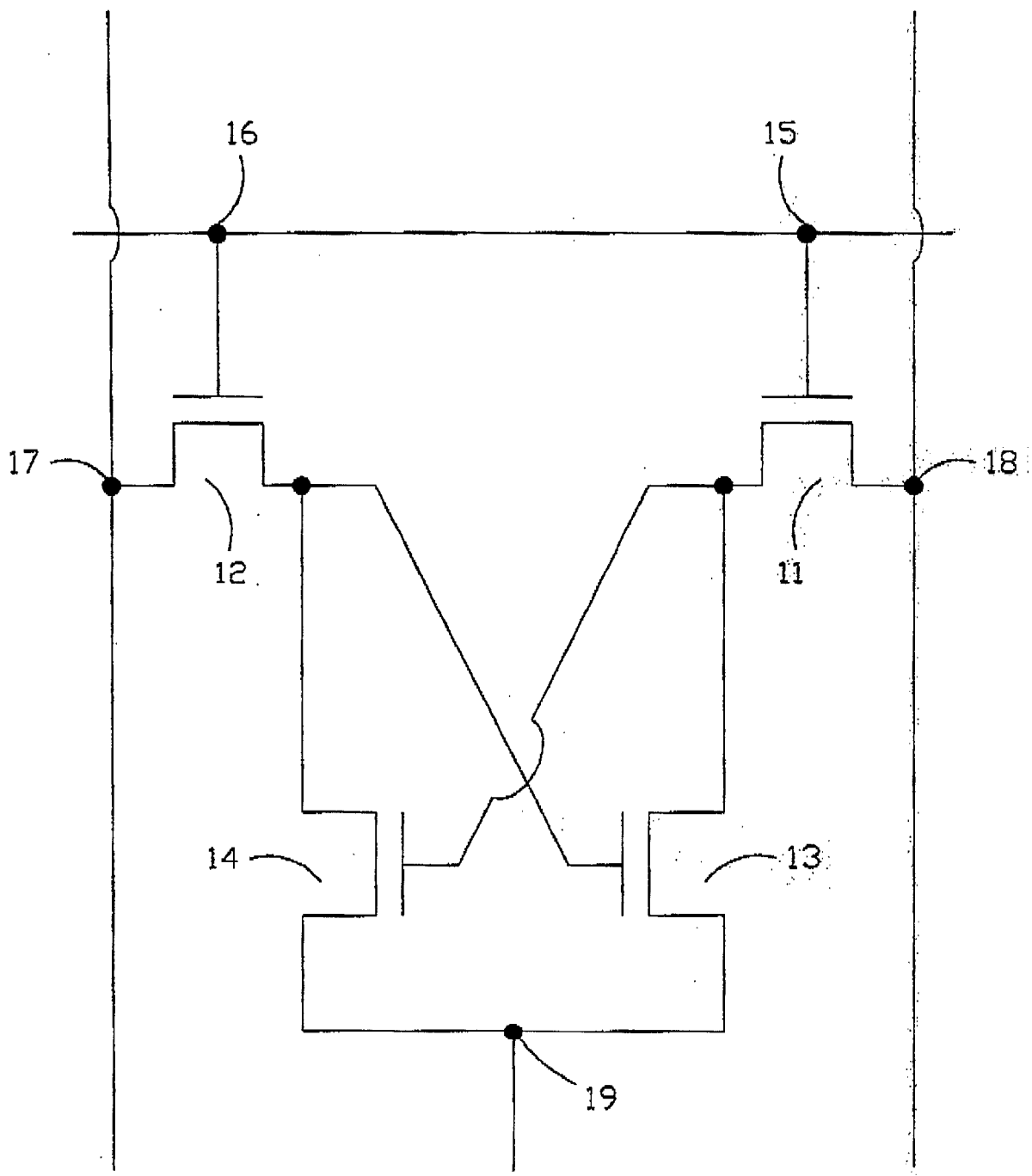
FIG. 1 is a sketch map illustrating circuit diagram of a conventional four-transistor SRAM cell.

By compare FIG. 2 with FIG. 1, it is crystal-clear that the main difference between the present four-transistors SRAM cell and well-known four-transistors SRAM cell is the relations between SRAM cell and word line(s). For well-know four-transistors SRAM cell, first transistor 11 and second transistor 12 are coupled to the same word line; but for the present four-transistors SRAM cell, first transistor 25 and second transistor 26 are coupled to different word lines.

Significantly, gate voltage of first transistor 25 and gate voltage of second transistor 26 can be adjusted separately.

Thus, when first transistor 25 and third transistor 27 are adjusted to be used to store data, although gate voltage of first transistor 25 can not be too extreme to affect operation of circuit which provided by both first transistor 25 and third transistor 27, gate voltage of second transistor 26 can be enough adjusted to let almost no leakage current is existent. In other words, by properly adjusting gate voltage of second transistor 26, third transistor 23 will not be turn on by leakage current of second transistor 26, and then quantity of stand-by current is reduced for less stand-by current is required to compensate lost current of third transistor 27.

Further, for most of case, and also for increasing of the present four-transistors SRAM cell, both first transistor 25 and second transistor 26 usually are P-type transistor, and both third transistor 27 and fourth transistor 28 are N-type transistor. Besides, both drain of third transistor 27 and drain of fourth transistor 28 is coupled to a common electric point 29, such as an electrical zero point. For a practical example, voltage of second word line terminal 22 is higher than voltage of first word line terminal 21 whenever the present memory cell is in stand-by and both second transistor 26 and first transistor 25 are P-type transistors. In other words, voltage of second transistor 26 is adjusted to reduce leakage current of second transistor 26.

Accordingly, the present four-transistor SRAM cell is suitable for low power product for it requires less stand-by current. Besides, owing to two word lines can be provided by multilevel metallization process, configuration of the present four-transistor SRAM cell can be essentially similar to that of well-known four-transistor, and then occupied area of the present four-transistors SRAM cell still is small. However, it should be emphasized that the present invention is focused on circuit of the present four-transistors SRAM cell but not the practical configuration of the memory cell. Any memory cell, any four-transistors SRAM cell, has a circuit-diagram as FIG. 2 shows is the subject, claimed range, of the present invention.

Figure 3A:
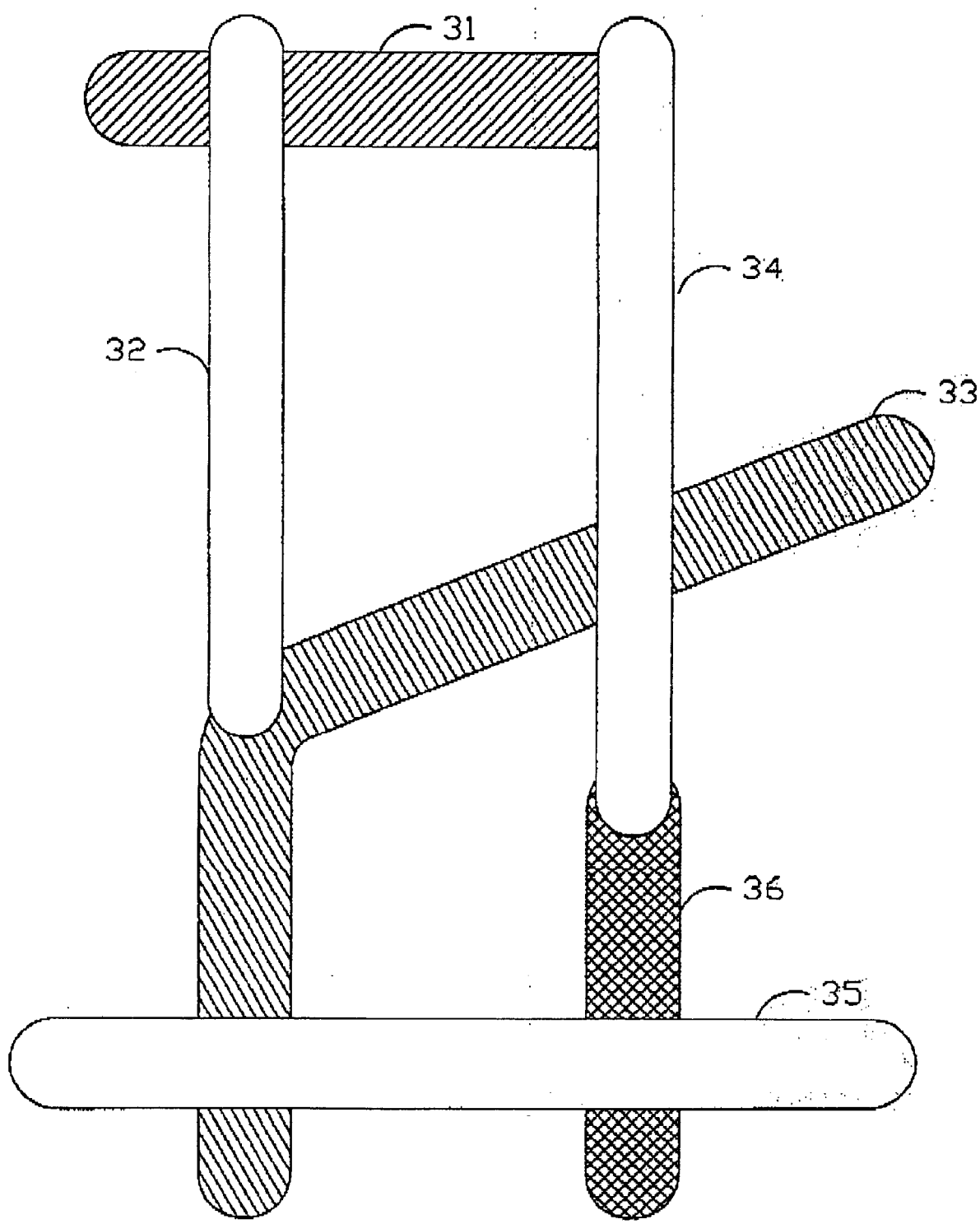
FIGS. 3A and FIG. 3B show sketch maps of two possible configurations of the embodiment.
Figure 3B:
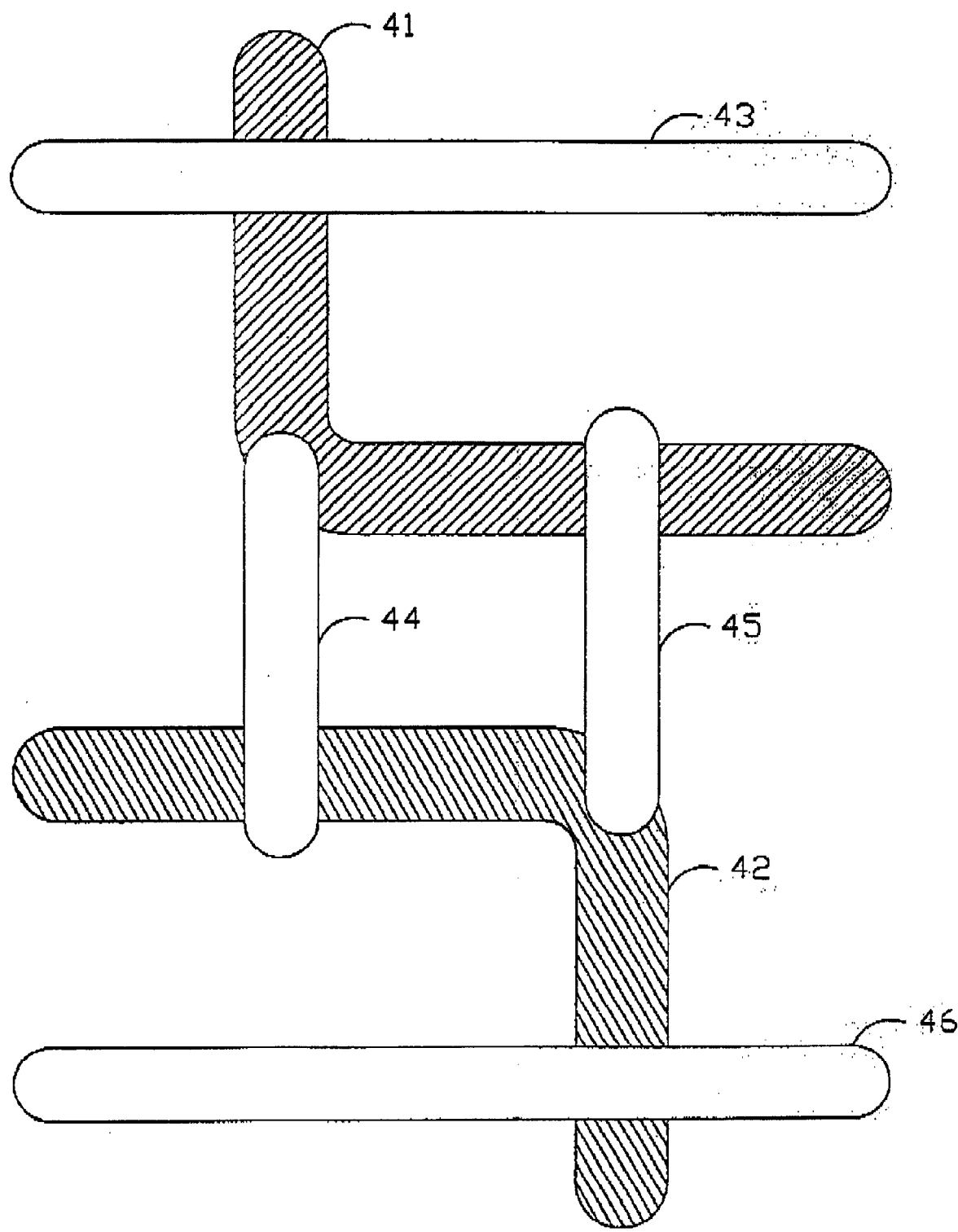

For showing some possible practical configurations, FIG. 3A and FIG. 3B briefly and qualitatively illustrate two examples. The Example shown in FIG. 3A at least includes fourth gates and three individual multi-doped regions where each is formed by a series of doped regions. Moreover, detail combination of any multi-doped region is different from that of other multi-doped region. Obviously, part of first multi-doped region 31, first gate 32 and part of second multi-doped region forms 33 fourth transistor, part of first multi-doped region 31, second gate 34 and part of second multi-doped region 33 forms third transistor, part of second multi-doped region 33 and third gate 35 forms second transistor, third multi-doped region 36 and fourth gate 37 forms first transistor. Moreover, third gate 35 is independent on fourth gate 37, and then multilevel metallization process is used to avoid third gate 35 is coupled with (or is connected to) fourth gate 37.

FIG. 3B shows another possible configuration of the present four-transistors SRAM cell. Herein, essential elements are first multi-doped region 41, second multi-doped region 42, first gate 43, second gate 44, third gate 45 and fourth gate 46. Certainly, detail combination of any multi-doped region is different from that of other multi-doped region, and also is different form that of FIG. 3A. Herein, part of first multi-doped region 41 and first gate 43 forms second transistor, part of second multi-doped region 42 and fourth gate 46 forms first transistor, part of first multi-doped region 41, part of second multi-doped region 42 and second gate 44 forms third transistor, part of first multi-doped region 41, part of second multi-doped region 42 and second gate 45 forms fourth transistor. Further, because first gate 43 and fourth gate 46 are located in opposite part of the cell, and also because that first gate 43 is parallel to fourth gate 46, it is possible that the configuration can be achieved without application of multilevel metallization process. Besides, first multi-doped region 41 comprises an N-type doped region and a P-type doped region, second multi-doped region 41 comprises an N-type doped region and a P-type doped region.

From the foregoing it will be appreciated that, although specific embodiments of the invention have been described herein for purpose of illustration, various modification may be made without deviating from the spirit and scope of the invention. Accordingly, the invention is not limited except as by the appended claims.

What is claimed is:

1. A memory cell, comprising:
   a first multi-doped region, wherein said first multi-doped region is formed by a plurality of doped regions;
   a second multi-doped region, wherein said second multi-doped region is formed by a plurality of doped regions;
   a first gate which is coupled to said first multi-doped region;
   a second gate which is coupled to both said first multi-doped region and said second multi-doped region;
   a third gate which is coupled to both said first multi-doped region and said second multi-doped region, wherein the interface of said second gate and said first multi-doped region is located between the interface of said first gate and said first multi-doped region and the interface of said third gate and said first multi-doped region; and
   a fourth gate which is coupled to said second multi-doped region, the voltage of said fourth gate being independent of the voltage of said first gate, wherein the interface of said third gate and said second multi-doped region is located between the interface of said second gate and said second multi-doped region and the interface of said fourth gate and said second multi-doped region.

2. The memory cell of claim 1, wherein said first multi-doped region comprises a N-type doped region and a P-type doped region.

3. The memory cell of claim 1, wherein said second multi-doped region comprises a N-type doped region and a P-type doped region.

\* \* \* \* \*